United States Patent [19]

Stenerson et al.

[11] Patent Number: 4,630,172

[45] Date of Patent: Dec. 16, 1986

[54] SEMICONDUCTOR CHIP CARRIER PACKAGE WITH A HEAT SINK

[75] Inventors: Gary L. Stenerson, Santa Cruz; Thomas J. Miller, Santa Clara, both of Calif.

[73] Assignee: Printed Circuits International, Santa Clara, Calif.

[21] Appl. No.: 473,482

[22] Filed: Mar. 9, 1983

[51] Int. Cl.⁴ .............................................. H05K 7/20
[52] U.S. Cl. ...................................... 361/386; 357/81; 361/401; 361/414
[58] Field of Search .............................. 361/385–387, 361/400–401, 414; 174/16 HS, 52 FP; 165/185; 357/74, 81

[56] References Cited

U.S. PATENT DOCUMENTS

| 2,942,165 | 5/1921 | Jackson et al. | 357/82 |
| 3,365,620 | 1/1968 | Butler et al. | 361/382 |
| 3,436,604 | 4/1969 | Hyltin et al. | 361/414 |
| 3,436,819 | 4/1969 | Lunine | 361/414 |
| 3,777,221 | 12/1973 | Tatusko et al. | 361/401 |
| 3,846,824 | 11/1974 | Bell | 361/386 |
| 3,958,195 | 5/1976 | Johnson | 357/81 |
| 4,338,621 | 7/1982 | Braun | 357/74 |

FOREIGN PATENT DOCUMENTS

| 1040747 | 10/1978 | Canada . | |
| 0079238 | 5/1983 | European Pat. Off. . | |
| 1248114 | 8/1967 | Fed. Rep. of Germany | 361/414 |
| 2413016 | 7/1979 | France | 361/386 |
| 1239634 | 7/1971 | United Kingdom . | |
| 1384823 | 2/1975 | United Kingdom . | |
| 1419163 | 12/1975 | United Kingdom . | |
| 2013027 | 8/1979 | United Kingdom . | |
| 2022317 | 12/1979 | United Kingdom . | |

Primary Examiner—A. D. Pellinen
Assistant Examiner—Greg Thompson
Attorney, Agent, or Firm—Thomas S. MacDonald; Alan H. MacPherson; Steven F. Caserza

[57] ABSTRACT

A semiconductor chip carrier and contact array package having an apertured dielectric bottom layer (11), one or more chip connection layers such as wire bond layers (16, 17) insulated from one another, at least one chip-holding recess (24) in the wire bond layers and a heat conductive copper heat sink insert (26) extending across the aperture of the dielectric layer and forming a base adapted to be in heat-conductive contact with the bottom of an integrated circuit chip (27) to be attached thereon whereby heat flux generated by the chip is quickly and efficiently removed from the chip body. The wire bond layers (16, 17) contains metallization patterns (29) for bonding to the chip and a grid array of contacts or connection pins (20) connected to plated through-holes in the wire bond layer(s) for plugging the carrier to a circuit board or the like. The various layers of the carrier per se are manufactured by predrilling and aperturing, forming the metallization patterns, stacking and pressure laminating to form a reliable compact structure having high heat dissipation properties.

11 Claims, 8 Drawing Figures

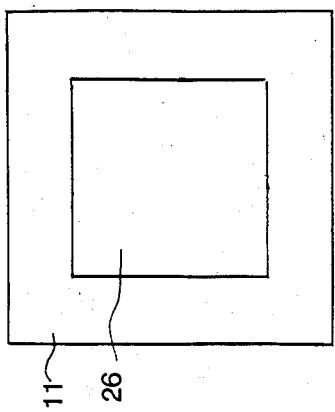
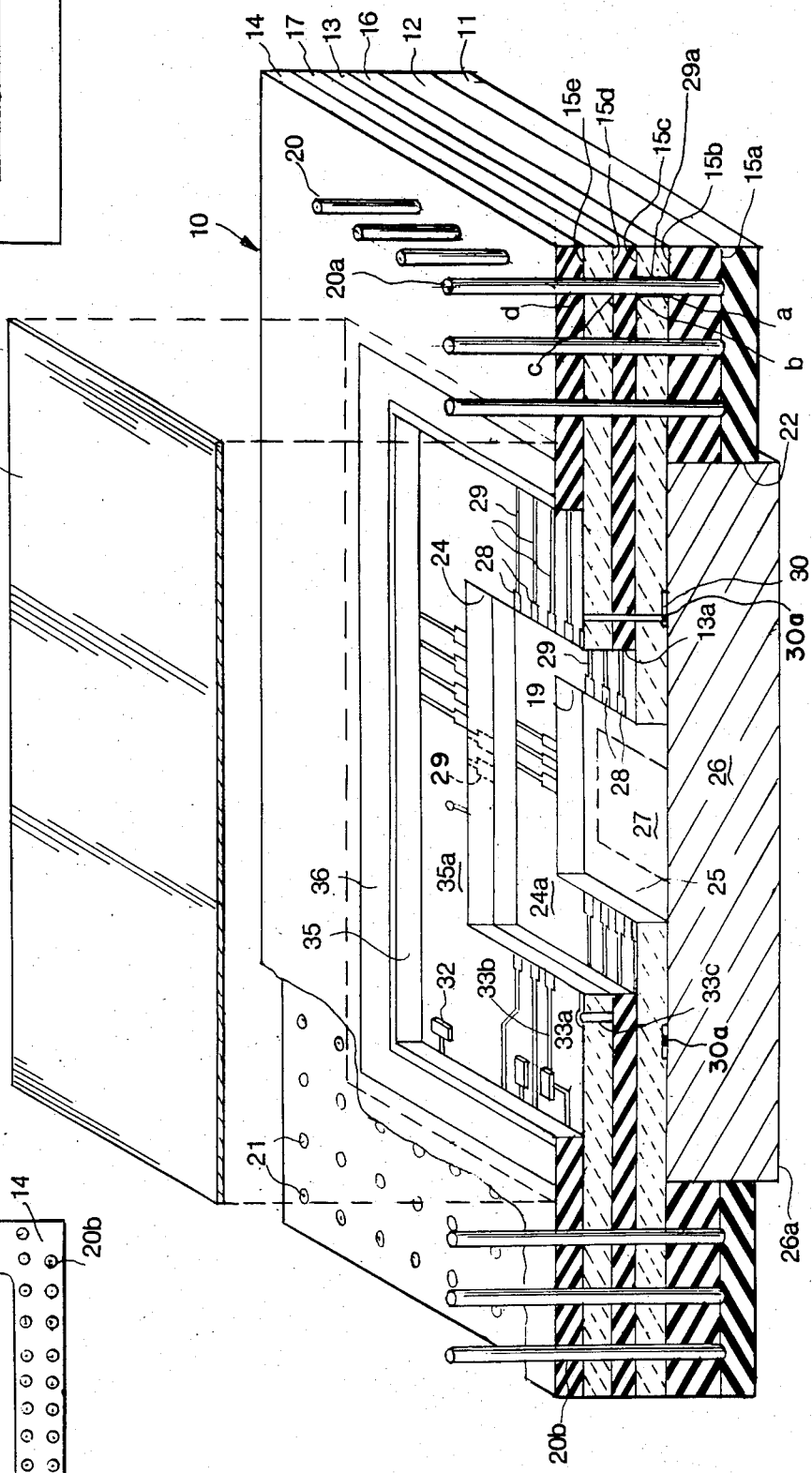
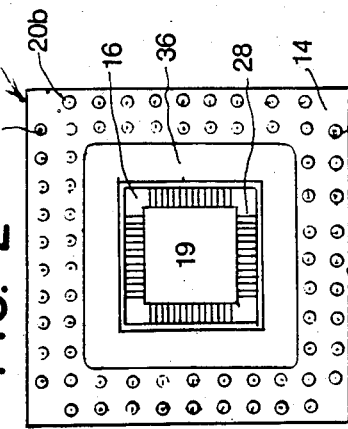

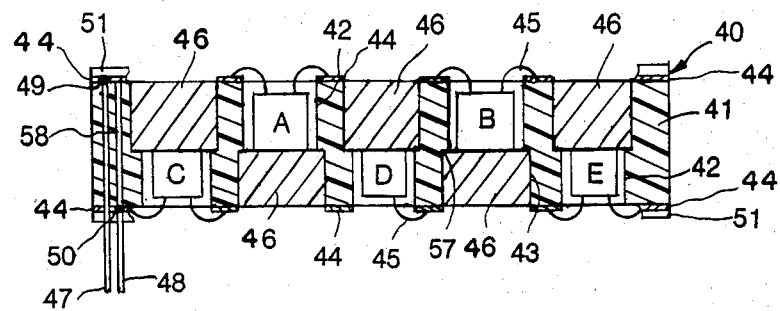
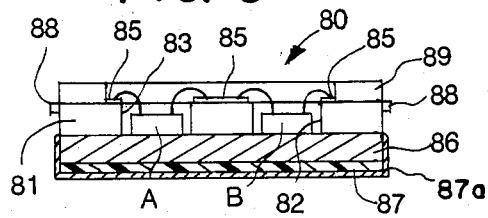
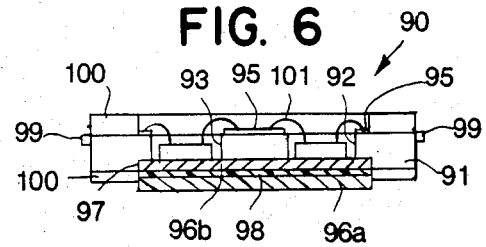
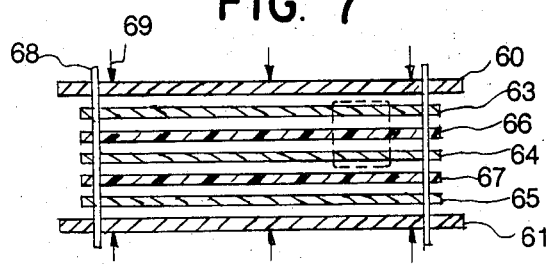
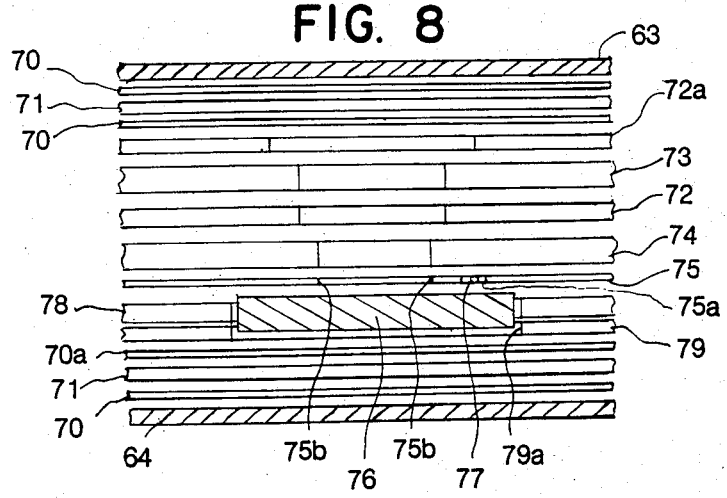

SEMICONDUCTOR CHIP CARRIER PACKAGE WITH A HEAT SINK

BACKGROUND OF THE INVENTION

1. Field of the Invention

This invention relates to semiconductor chip packages, more particular to a carrier for one or more chips, which exhibits excellent thermal properties in dissipating heat from a carried chip and a method of manufacture of such carrier.

2. Description of the Prior Art

Various chip carriers have been proposed and constructed which include a ceramic substrate and a die-cavity into which the chip or die is placed. The die or chip is typically a semiconductor device or large scale integrated circuit. The chip is interconnected to a metallization pattern on the ceramic, non-conductive substrate surface and a grid array of pins electrically connected to the pattern, the pins in turn, being adapted to plug into another integrated circuit chip carrier socket or to a printed circuit mother board. It has been recognized that the heat generated by an operating chip may be detrimental not only to the chip itself but to other adjacent electronic components and overall package integrity. Heat has been removed heretofore by heat conduction passage through the pins and the ceramic material. This is not an efficient way of removing heat and entails integrated circuit and packaging design considerations which limit the number of the pins in a particular array and the efficiency and overall capability of the integrated circuits. As chips and chip packages become more and more miniaturized the problem of heat generation and the need for heat dissipation becomes more acute.

U.S. Pat. No. 4,338,621 recites various prior art heat dissipating means including IBM Technical Disclosure Bulletin Vo. 22, No. 4, Sept. 1979, page 1428–29 which shows a carrier including a primary upper heat sink through which coolant fluid is passed and a lower heat sink surrounding the die cavity and attached by solder to a metallized ceramic substrate on which chips are preplaced, the resultant carrier being then affixed by solder to a circuit board. The '621 patent provides a base member and cover member having mating electrical pads and in which both members are formed of thermally conductive ceramic material to dissipate heat from a chip bonded to an interior surface of the base member. The carrier faces an open-air stream with optional cooling fins being provided to enhance heat dissipation. The chip carrier hereafter described obviates the more complicated heat rejection techniques heretofore known in the chip carrier art and results in improved heat dissipation for the higher power integrated circuits.

SUMMARY OF THE INVENTION

In accordance with the present invention a semiconductor chip carrier and contact array package is provided which includes apertured dielectric layers and one or more chip interconnect layers bonded to the dielectric layers and including metallization patterns and contact pads on one or both sides of these layer(s). "Chip interconnect" layers as used herein include wire bonding where a thin wire connects the chips to carrier contacts, solder bumps where solderable pads (bumps) on the chip overlie solderable pads on the carrier, welding, or other connection techniques such as using beam tape. The chip interconnect layer(s) contains a chip-holding recess and a discrete separate base of highly heat conductive material, preferably copper, extends within the aperture of the dielectric layer and bridges or lies across the bottom of chip placement position(s) in the recesses. The outwardly exposed copper base in usage normally faces outwardly from the mother board to which it is to be attached so as to allow for better ambient air-cooling. Provision is also made to provide one or more open stepped ledges for mounting of additional electronic components in the carrier and connected to portions of the metallization patterns.

The various layers are compacted together by a method set forth herein to form an integral useful structure ready to receive contact pins extending outwardly from the structure. In such resultant form the carrier may be shipped to a customer for die attachment to the copper heat sink insert and bonding of the chip to the metallization patterns.

When compared to today's industry standard ceramic chip carriers, such as those available from Kyocera Co. or NGK, a carrier structure is provided which affords tighter tolerances, tightly controlled dimensions, allows high density of components and input-output terminals, results in a more pliable, less brittle package, has lower unit costs in the area of 20–60%, has superior current carrying capacity, tighter contact areas, i.e., less than 100 mil spacing, superior heat dissipation of the order of 2–3 times that of ceramic carriers, reduced inductance and capacitance, less circuit resistance, increased reliability due to absence of micro-cracks, lower set-up fees and excellent thermal co-efficient of expansion compatability with respect to those structures to which the chip carrier is electrically connected and physically mounted. The carrier of this invention is not subject to alpha particle emissions existent with the use of conventional ceramic circuit substrates and protects the chips, components and circuits from such emissions from outside sources.

The above attributes are realized by providing a copper heat sink or insert exposed on one side for contact with a semiconductor chip and having its opposite side exposed to a more cool ambient whereby heat flux from the chip is quickly and efficiently removed from the chip body. A high density of pins or other contact arrangements forming an array around a component-mounting ledge(s) is also provided.

BRIEF DESCRIPTION OF THE DRAWINGS

FIG. 1 is a partial cut-away cross-sectional perspective view of the chip carrier.

FIG. 2 is a top view of a completed carrier.

FIG. 3 is a bottom view of a completed carrier.

FIG. 4 is a cross-sectional view of a multiple chip carrier with chips shown mounted on both sides.

FIG. 5 is a cross-sectional view of a modified form of chip carrier with chips mounted.

FIG. 6 is a cross-sectional view of a further modification of the carrier with chips mounted.

FIG. 7 is a cross-sectional view of the tooling lay-up illustrating the overall manufacturing technique for production of multiple chip carrier packages.

FIG. 8 is an exploded cross-sectional view taken on the encircled area of FIG. 7 of a lay-up forming one chip carrier and illustrative of its manufacturing technique.

DETAILED DESCRIPTION OF THE DRAWINGS

FIG. 1 shows a chip carrier 10 of this invention. It comprises a bottom dielectric layer 11 which is cut out at 22 to form a generally rectangular aperture. Aperture 22 generally extends over a majority of the surface area of dielectric layer 11. A second dielctric layer 12 may be provided which is adhesively bonded by insulative bonding agent 15a to means 11. A chip connection layer such as wire bond layer 16 extends above and has a smaller aperture than aperture 22. Layer 16 is adhesively bonded to substrate 12 by bonding agent 15b. A third dielectric layer 13 having a central aperture 13a larger than the aperture in layer 16 is employed above the first wire bond layer 16 as a top layer (not shown) or as an intermediate insulative layer between layer 16 and a second wire bond layer 17. Bonding agents 15c and 15d bond layer 13 to the respective wire bond layers. If the carrier is to include two wire bond layers, the chip carrier laminate lay-up is completed by adding a top dielectric layer 14 bonded by adhesive 15e to the top side of the upper wire bond layer 17. Layer 14 is apertured by wall 35 forming a recess 35a bounded by that wall 35.

It is understood that the chip carrier may have just one wire bond layer or may have two or more wire bond layers in its overall cross-sectional configuration. The term "chip connection means" as used herein means a layer such as wire bond layer 16 or two or more wire bond layers such as wire bond layers 16 and 17. The wire bond layers 16 and 17 have metallization patterns 29 on the top and/or bottom of the layers. The metallization patterns 29 normally include bonding areas or contact pads 28 to which the integrated circuit chip leads are later attached. One or more recesses 19 and 24 are formed in the wire bond layers 17 and 16, respectively, recess 19 being particularly suitable in area for placement of semiconductor chip(s).

A series of electrical contacts or pins 20 extend through apertures 20b in the stack of various layers 12–17 and extend outwardly therefrom. The outwardly extending portions are connectible in use to a mother or daughter circuit board or socket and the lower pin portions extend to and are connected at various levels of the various layers. The bottom of the pins 20 may extend into the adhesive layer 15a between dielectric layers 11 and 12 or if suitably insulated, extend through the dielectric flush with or extend beyond the back side of layer 11.

Plated through-holes 33c are provided in various layers for electrical side-to-side connection. Soldering assists in electrical connection and thus provision is made for the soldering of the pins to contact pads and plated through-holes on the various wire bond metallization pattern levels. For example, a solder "donut" may be placed over a pin and a drill hole in the laminate stack and when heated will, by capillary action, move down the outside surface of the pin and be captured by the particular metallization pattern at the particular circuit level concerned. The main electrical contacts are made by the pins being forced into physical contact with the walls or barrel of the plated through-holes. Thus, pin 20a, for example, may be electrically connected at points a, b, c or d on wire bond layers 16 and 17, respectively, or to other conductive layers (not shown). As shown, for example, point b affords a connection between pin 20a and the metallization pattern 29 on the upper surface of layer 16 and through the plated through-barrel 29a or wall of wire bond layer 16 to point a on its lower surface. The pins may be connected to any circuit pattern or contact on any level.

The situs of a chip to be mounted in a completed carrier is seen in dotted outline 27 situated on a top surface 25 of a base 26 of high conductivity material, preferably copper, which is insertable within the aperture 22 of dielectric layers 11 and 12 and abuts and is insulatively bonded to the bottom surface of wire bond layer 16 by an insulative bond agent layer 15b. Base or insert 26 provides a large mass of high thermally conductive material which will quickly and efficiently remove the large amounts of heat associated with the relative high power (as much as 13 watts or more) which can be generated in a modern integrated circuit.

A typical 1⅛ inch square chip carrier has a peripheral zone approximately 3/16 of an inch in width containing an array of approximately 68 pins with a central recess having a width of 5/16 of an inch which is bottomed by surface 26a of the copper base 26. Base 26 may have a square configuration of ⅝ of an inch. In a more complex embodiment, a 170 pin array package is provided in a 1¾ inch square carrier, with the pin array in a ⅞ of an inch peripheral land pattern around the periphery of the carrier. The copper base 26a is 1 inch square with a 5/16 inch square portion exposed to the recess.

The multiple recesses shown in FIG. 1 allow for sufficient surface areas 24a and 35a on the upper surface of the wire bond layers or on surfaces adjacent to other cavities to accommodate a series of other electric components 32 which may be connected by metallization patterns 33a and 33b to a particular pin of the array or contact of the chip. It it is desired to ground a particular component or pin to the metal base 26 an aperture(s) 30 is provided within the adjacent adhesive material so as to accommodate a conductive epoxy material globule 30a. This makes a suitable electrical and/or ground connection between the copper base 26 and the metallization pattern on the underside of layer 16 leading to a particular pin of the pin array. The ground or electrical connection is made via a pin and plated through-hole interface making a connection from a pad on surface 35a to a pad on surface 24a.

An epoxy or other adhesive layer may be provided on the top surface of layer 14 around the periphery of the upper recess 35a and a metal or plastic (opaque or transparent to be able to erase EPROM devices by UV light) cover plate 34 provided thereover which may be sealed to the carrier. Alternatively, a metal cover 34 may be solder bonded to a metal ring or pattern 36 on layer 14. It is also contemplated that the cover may encompass the entire top surface of the carrier and include apertures for the pin array.

It is to be realized that the illustration in FIG. 1 does not show all the pins in the array. Pins normally will be placed in each but not necessarily all of the apertures 21 shown on the top surface of dielectric layer 14. Some of the apertures may be used for interconnecting patterns for discrete devices on the top and bottom of a layer. The chip holding recess, after chip attachment and lead connection by the user, may be filled with a glop sealing compound, such as RTV plastic, to seal, i.e., pot the chip, wire bonds, contacts, components, etc.

The dielectric layers may be standard glass-filled epoxy laminates employed in printed circuit board manufacture or may be molded plastic substrates or layers, such as polysulfone, on to which is plated the required circuits and bonding areas for connection with the inputs/outputs of the recessed chip(s).

FIG. 2 shows a completed carrier 10. Pins 20 extend in an array around the periphery of the carrier and are located in apertures 20b. A central recess 19 is formed in the carrier on to which an integrated circuit chip (not shown) may be attached by solder bonding, by conductive adhesive or other means allowing transfer of heat. A series of contact pads 28 extend around the periphery of recess 19 on the top side of a wire bond layer 16 extending in plane below the top dielectric layer 14 of the carrier. Ring seal 36 surrounds the recess 19 and is adapted to receive a metal lid (not shown) after the customer has had the chip inserted into recess 19 and bonded to pads 28.

FIG. 3 shows the bottom of the carrier of FIG. 2 with the underside of dielectric layer 11 surrounding the exposed base 26. Base 26 may extend outwardly or may be flush therewith or can be recessed from the plane of dielectric layer 11. Conductive fins can be added for additional cooling. It has been found most advantageous in connecting the chip carrier with its associated chip to a mother or daughter printed circuit board or other structure to have the underside of the carrier as shown in FIG. 3 face outwardly in the ambient since approximately 90% of the heat generated by the chip exits from the bottom surface of the chip and only 10% from the top surface of the chip. Thus, that top surface of the carrier shown in FIG. 2 will be mounted by a pin connection against the mother board, for example, and the bottom surface shown in FIG. 3 positioned exposed to the cooling ambient.

FIG. 4 shows a modified chip carrier 40 including a series of chip carrying recesses 42 formed in a wire bond layer 41. Dielectric layers 51 (shown cut away) are provided on the exterior of both sides of bond layers 41. A series of somewhat larger recesses 43 are provided in layer(s) 41 and the copper base or insert 46 is attached therein by suitable adhesive 57. A force fit of the insert into the recess may also be employed. Metallization patterns 44 are placed on the surfaces of the wire bond layer 41 and when used are electrically connected by wires 45 to the input/output of a series of semiconductor chips A, B, C, D and E previously mounted in heat conductive relation to the inserts 46, 56 a facing surface of which is at the bottom of each recess 42. Metallization patterns 44 extend to pins 47, 48 at the peripheral edges or other locations on the carrier as illustrated in FIG. 1. A small donut of solder preform 49, 50 is placed adjacent to the metallization pattern and the pin peripheral surface which, when heated, will assist to electrically connect the particular pin to the metallization pattern through plated through-hole 58 for example. Pin 47 is shown connected to the metallization pattern on the top surface of the wire bond layer 41 of the carrier and pin 48 connected to a pattern on the bottom surface of the layer 41. In this embodiment heat generated by the chips A–E is ejected in upper and lower directions from the carrier.

FIG. 5 shows another modification of the carrier 80 having a wire bond layer 81 with two recesses 82, 83 formed through the laminate 81. A copper insert 86 is insulatively bonded to the unapertured insulative portions of wire bond layer 81 and bridges the bottom of the recesses 82 and 83. A metallization pattern 85 is provided on the top surface of the layer 81 leading to contacts 88 formed on the peripheral surface of wire bond layer 81. The contacts are connected to chips A and B subsequently mounted in recesses 82 and 83 in thermal contact with an underlying portion of the upper surface of copper insert 86. An insulative dielectric layer 87 of 1 to 2 mils in thickness is provided to electrically insulate insert 86 but is of sufficient thinness not to appreciably affect the heat transfer capabilities of the copper material 86. Dielectric layer 89 is provided on the top of wire bond layer 81 and is apertured to form the chip recesses. A suitable cover (not shown) may be employed.

FIG. 6 further shows an additional modification of a carrier 90 containing a wire bond layer 91 having recess 92 and 93 therein. Metallization patterns 95 are provided on the upper surface of the wire bond layer 91 leading to contact pad areas 99 at a peripheral edge of the carrier. An insert of copper material 96a, 96b is provided in a lower recess 97 contained in the wire bond layer. An electrically grounding insulating layer 98 of 1 to 2 mils in thickness is provided between the upper insert portion 96a and lower insert portion 96b which portion 96b extends outwardly from the bottom plane of the wire bond layer 91. This outward extension creates turbulence of air passing by the insert surfaces to allow better heat dissipation and creates a greater surface area exposed for radiation of the heat flux being removed from the chips A and B to the ambient. Insulation layer 98 alternatively may be positioned on the top surface to portion 96a so that the chip bottom surface is directly bonded to the insulative layer. The chip inputs and outputs are connected by wires 101 to the metallization patterns. Apertured dielectric layers 100 are contained on the upper and lower surfaces of wire bond layer 91 and are apertured to receive the recesses and inserts, respectively. It is contemplated that additional chips may be mounted either in recesses or in areas of the metallization pattern 95 at different levels, and such additional chips may or may not be bonded to copper inserts.

In each of the above embodiments it is preferred that the copper insert including its peripheral edges be encapsulated with a nickel barrier flash of about 50 microinches in thickness and then electroplated with gold of about 6–50 microinches in thickness as collectively shown by layer 87a in FIG. 5. Thus allows the copper base to be used as a wire bond or other electrical contact area. It also makes the insert relatively inert, i.e., one which will not oxidize or form dendritic growths or the like which could short out adjacent contacts or electrical pathways. The above metal layers are not appreciably detrimental to the heat conductive properties of the insert.

FIGS. 7 and 8 illustrate the manufacturing process utilized in making the chip carrier of this invention. The series of laminate layers (a stack) discussed with respect to FIG. 1 are illustrated in FIG. 7 as stacks 66 and 67. Normally, two or more stacks 66 and 67 are utilized in a fixture for laminating multiple chip carriers. Each of the stacks 66 and 67 have a typical surface area of 12×18 inches so that they contain in one processing stack a matrix of chip carriers, for example, 120 chip carriers per stack. A series of smooth, flat, rigid caul plates 63, 64 and 65 are provided on each side of the stacks 66 and 67 for applying direct pressure to the laminate stacks for bonding purposes. The caul plates and laminate stacks are placed in a fixture having suitable tooling pins 68 between a bottom tooling fixture plate 61 and a top tooling fixture plate 60. Pressure is placed on the tooling plates and heat applied so that the laminates in stacks 66 and 67 are bonded together forming the multiple array of chip carriers. These chip carriers, once the laminated stacks 66 and 67 are removed from the fixture, are then profiled to the size of the individual chip carriers shown in FIG. 2, for example.

FIG. 8 illustrates the method of making the laminate stack 66 shown in FIG. 7, which extends between caul plates 63 and 64. Starting next to bottom caul plate 64, a Tedlar release film 70 is provided as the bottom layer of the stack. A conformal molding layer 71 of rubbery polymeric material such as Fortin ACC #1 which is adapted by the heat and pressure of the FIG. 7 press operation to soften and move into any interstices or irregularities in the laminated stack to assure even pressure distribution over the whole cross-sectional area of the assembly, is placed on the Tedlar release film layer 70. Thickness of the conformal molding is dictated by the depth of the recesses in the work layers. A second Tedlar layer 70a is placed over the conformal molding 71. Copper heat sink insert 76 is then placed centrally over layer 70a in a portion corresponding to the chip-forming recess as in FIGS. 1-3. A ghost layer 79 apertured at 79a to receive insert 76 is placed on top of the Tedlar layer 70a in order to compensate for the degree that the insert 76 will extend out from the bottom of the carrier as in the optional design shown in FIG. 6. This ghost layer, if utilized, will be reomoved from the assembly after the pressure forming operation of FIG. 7. Above the ghost layer is an apertured first dielectric layer 78 which may be one layer or multiple layers as shown in FIG. 1, which surrounds the outer periphery of the copper sink insert 76. A dielectric adhesive layer 75, normally in the form of a film, having a recess 75b in its inner periphery is next laid on top of a peripheral portion of insert 76. An aperture 75a is provided in layer 75 through which a globule 77 of conductive adhesive may be inserted so as to be able to electrically connect a circuit on wire bond layer 74 to the surface of the copper heat sink 76 for electrical connection or grounding purposes. Wire bond layer 74 is next mounted on layer 75 and as heretofore described contains on one or more of its surfaces a metallization pattern conforming to that desired to connect the various outputs and inputs of the semiconductor die placed in the final recess cavity of the carrier when used. A succeeding second dielectric layer 72 separates bond layer 74 from succeeding wire bond layer 73. A third dielectric layer 72a is placed over bond layer 73.

Adhesive insulating films indicated by the crosses are placed between the various dielectric and wire bond or circuit layers 73 and 74. Upon application of heat and pressure these adhesives layers soften and effectively bond the "sandwich" of dielectric layers and wire bond layers together. As shown, each of the wire bond, dielectric and adhesive layers are apertured to form the chip-holding recess. A Tedlar release film(s) is then placed over the top of dielectric layer 72a on the upper surface, then a second layer(s) of conformal molding 71 and a last layer of Tedlar release film 70 between the conformal moulding and caul plate 63.

The platens of the phases are heated to a temperature normally in the range of 300°-350° F. and pressure on the press is brought to about 25% of the required pressure for 15-30 minutes to allow time for the materials to heat up and the conformal molding to soften. The pressure is increased to the optimum required pressure of 75-150 PSI for an additional 45 minutes. The heaters are turned off and the platens including the formed chip carriers are cooled to approximately room temperature which takes approximately 15-45 minutes under the above pressure regime. The pressure is then released and the bonded stacks of carrier devices removed from the press and the registration pins removed from the stack by means of an arbor press. Pinning and pin soldering is accomplished on standard automatic equipment. While FIG. 4 shows the use of solder donuts, solder paste or tin-plated pins may also be employed. Individual carriers are then blanked, punched or routed out from the stack holding the multiple carriers. The Tedlar release layers, conformal molding and ghost layer are discarded after pressing.

In the overall manufacturing process various unit processes are performed on the individual layers. The following Table I is illustrative of the detailed processing steps which are employed. Each of these steps are individually known in the art including desired concentrations, times, materials, thickness, etc., but the selection of these steps in the order given in Table II and primarily in the fact that the various drilling operations on the various layers are performed prior to layup and pressing of the overall stack is different from conventional processing.

TABLE I

| Key | Process Operation |
|---|---|
| A. | Material Preparation |
| B. | Drilling/Aperturing |
| C. | Electroless Plating/Flash Plating (as required) |
| D. | Imaging |
| E. | Electro Plating |
| F. | Stripping |
| G. | Etching |
| H. | Blanking/Routing (Profiling) |
| I. | Layup and Press |
| J. | Solder Mask |
| K. | Pin Insertion/Soldering |
| L. | Cleaning/Packaging/Testing |

Table II illustrates the preferred utilization of those individual steps enumerated in Table I which are performed on the individual layers I-IV making up the stack of layers to be pressure bonded in the final operation V. The layers I-IV are positioned as seen in FIG. 8.

TABLE II

| I BOND LAYERS | II PLATED LAYERS | III ADHESIVES/ RELEASE AGENTS CONFORMAL MOLDING | IV HEAT SINKS/ LIDS | V LAMINATION/FINALIZATION |
|---|---|---|---|---|
| A | A | A | A | J |
| B | B | B | H | I |
| C | C | H | E | H |
| D | D | | | K |
| G | E | | | L |
| F | F | | | |
| E | G | | | |

TABLE II-continued

| I BOND LAYERS | II PLATED LAYERS | III ADHESIVES/ RELEASE AGENTS CONFORMAL MOLDING | IV HEAT SINKS/ LIDS | V LAMINA- TION/FINAL- IZATION |
|---|---|---|---|---|
| H | H | | | |

Definitions, TABLE II:
1. Bond Layers
Any layer where a wire bonding operation is required.
2. Plated Layers
Any layer requiring a plated circuit or metallized pattern but is not wire bonded in subsequent operations.
3. Adhesives/Release Agents/Fillers
Materials used for adhesives or release agents, or fillers during the lamination process.
NOTE:
The bond layer process steps in I accommodates total encapsulation of the circuitry and minimizes any entrapment of contaminating chemicals. If by the design of the desired circuit arrangement the process steps of I cannot be utilized, the process steps of II can be employed to make the bond layers.

The resultant semiconductor chip carrier is then ready for transmission to a customer or otherwise for positioning of the IC chip in the formed recess, die attaching the chip by conductive adhesive or eutectic metal bonding to the copper heat sink insert top surface and then connecting the chip to the various levels of metallization pattern in the wire bond layers. It is to be understood that the chip recess shown adjacent to the copper slug 26 namely recess 24a may extend upwardly to the top surface of wire bond layer 17 in FIG. 1 or various step levels provided, as shown, to form an additional component-mounting ledge 35a. The ledge(s) also facilitate bonding of the multiple contacts of the semiconductor die to the contact pads 28 existing at the exposed levels of wire bond layers 16 and 17 at those ledges.

The above description of the embodiments of this invention are intended to be illustrative and not limiting. Other embodiments of this invention will be obvious to those skilled in the art in view of the above disclosure.

We claim:

1. A semiconductor chip carrier and contact array package comprising:
   (a) a first dielectric layer;
   (b) an aperture in said layer;
   (c) chip connection means, having one or more wire bond layers for connecting chip contacts thereto, said chip connection means being bonded to a surface of said dielectric layer, said chip connection means including multiple discrete metallization patterns on said one or more wire bond layers;
   (d) a chip-holding recess in said chip connection means;
   (e) a base of heat-conductive material extending across said aperture and below said chip connection means;
   (f) said base lying at least in part across said recess and extending through said dielectric layer aperture such that the base is exposed to ambient;
   (g) an integrated circuit chip mounted in said recess in heat-conductive contact with said base, said chip having chip contacts connected to said metallization patterns;
   (h) a contact array of pin contacts extending to and in electrical contact with particular ones of said multiple metallization patterns and extending perpendicularly from said chip connection means, said contact array pin contacts extending outboard of said recess; and
   in which said chip connection means comprises at least two wire bond layers having connective pads at multilevels within the carrier to electrically connect said contact array thereto, said pads being electrically connected to chip leads extending from the mounted chip.

2. A semiconductor chip carrier and contact array package comprising
   (a) a first dielectric layer;
   (b) an aperture in said layer;
   (c) a chip connection means having one or more discrete wire bond layers for connecting chip contacts thereto, said chip connection means being bonded to a surface of said dielectric layer, said chip connection means including multiple discrete metallization patterns;
   (d) a chip-holding recess in said chip connection means;
   (e) a base of heat-conductive material extending across said aperture and below said chip connection means;
   (f) said base lying at least in part across said recess;
   (g) an integrated circuit chip mounted in said recess in heat-conductive contact with said base and connected to said metallization patterns; and
   (h) a contact array of pin contacts extending to and in electrical contact with particular ones of said multiple metallization patterns and extending from said chip connection means, said contact array pin contacts extending outboard of said recess and wherein said contact array is a multipin grid array connected by through-hole plating to said chip connection means.

3. The invention of claim 2 comprising a multiplicity of chip-holding recesses in said one or more wire bond layers and in which said base comprises a series of base members each in contact with a mounted integrated circuit chip.

4. The invention of claim 3 in which said multiple recesses and said base members each are on opposed sides of said chip connection means so as to dissipate heat from said integrated circuit chips on both sides of the carrier.

5. A semiconductor chip carrier and contact array package comprising
   (a) a first dielectric layer;
   (b) an aperture in said layer;
   (c) chip connection means, having one or more discrete wire bond layers, for connecting chip contacts thereto, said chip connection means being bonded to a surface of said dielectric layer, said chip connection means including multiple discrete metallization patterns;
   a chip-holding recess in said chip connection means;
   (e) a base of heat-conductive material extending across said aperture and below said chip connection means;
   (f) said base lying at least in part across said recess;
   (g) an integrated circuit chip mounted in said recess in heat-conductive contact with said base and connected to said metallization patterns;
   (h) a contact array of pin contacts extending to and in electrical contact with particular ones of said multiple metallization patterns and extending from said chip connection means, said contact array pin contacts extending outboard of said recess; and
   (i) in which an apertured second dielectric layer is bonded to said first dielectric layer, said contact array comprising a series of pin contacts having their inner ends terminating at a level between said dielectric layers.

6. The invention of claim 5 in which said base extends through the apertures of both said dielectric layers.

7. A semiconductor chip carrier and contact array package comprising
 (a) a first dielectric layer;
 (b) an aperture in said layer;
 (c) chip connection means, having one or more discrete wire bond layers, for connecting chip contacts thereto, said chip connection means being bonded to a surface of said dielectric layer, said chip connection means including multiple discrete metallization patterns;
 (d) a chip-holding recess in a chip connection means;
 (e) a base of heat-conductive material extending across said aperture and below said chip connection means;
 (f) said base lying at least in part across said recess;
 (g) an integrated circuit chip mounted in said recess in heat-conductive contact with said base and connected to said metallization patterns;
 (h) a contact array of pin contacts extending to and in electrical contact with particular ones of said multiple metallization patterns and extending from said chip connection means, said contact array pin contacts extending outboard of said recess; and
 (i) further comprising multiple chip-holding recesses in said wire bond layers;
 (j) an integrated circuit chip mounted in each of said multiple chip-holding recesses;
 (k) in which said base comprises a series of base members each in contact with a chip mounted in said multiple chip-holding recesses; and
 (l) in which said multiple chip-holding recesses and said base members each are on opposed sides of said chip connection means so as to dissipate heat from said chips in said multiple chip-holding recesses on both sides of the carrier.

8. A semiconductor chip carrier and contact array package comprising
 (a) a first dielectric layer;
 (b) an aperture in said layer;
 (c) chip connection means, having one or more discrete wire bond layers, for connecting chip contacts thereto, said chip connection means being bonded to a surface of said dielectric layer, said chip connection means including multiple discrete metallization patterns;
 (d) a chip-holding recess in said chip connection means;
 (e) a base of heat-conductive material extending across said aperture and below said chip connection means;
 (f) said base lying at least in part across said recess;
 (g) an integrated circuit chip mounted in said recess in heat-conductive contact with said base and connected to said metallization patterns;
 (h) a contact array of pin contacts extending to and in electrical contact with particular ones of said multiple metallization patterns and extending from said chip connection means, said contact array pin contacts extending outboard of said recess; and
 (i) further comprising means to electrically insulate an outwardly facing heat rejecting face of said base, while minimizing degradation of the thermal heat conductivity of said base.

9. A semiconductor chip carrier and contact array package comprising
 (a) a first dielectric layer;
 (b) an aperture in said layer;
 (c) chip connection means, having one or more discrete wire bond layers, for connecting chip contacts thereto, said chip connection means being bonded to a surface of said dielectric layer, said chip connection means including multiple discrete metallization patterns;
 (d) a chip-holding recess in said chip connection means;
 (e) a base of heat-conductive material extending across said aperture and below said chip connection means;
 (f) said base lying at least in part across said recess;
 (g) an integrated circuit chip mounted in said recess in heat-conductive contact with said base and connected to said metallization patterns;
 (h) a contact array of pin contacts extending to and in electrical contact with particular ones of said multiple metallization patterns and extending from said chip connection means, said contact array pin contacts extending outboard of said recess; and
 (i) in which said base is encapsulated with an inert electrically conductive layer.

10. A semiconductor chip carrier and contact array package comprising
 (a) a first dielectric layer;
 (b) at least one aperture in said layer;
 (c) chip connection means, having one or more discrete wire bond layers, for connecting chip contacts thereto, said chip connection means being bonded to a surface of said dielectric layer, said chip connection means including multiple discrete metallization patterns;
 (d) at least one chip-holding recess in said chip connection means;
 (e) a base of heat-conductive material extending across said at least one aperture and below said chip connection means;
 (f) said base lying at least in part across said at least one recess;
 (g) an integrated circuit chip mounted in said at least one recess in heat-conductive contact with said base;
 (h) a contact array of pin contacts extending to and in electrical contact with particular ones of said multiple discrete metallization patterns and extending from said chip connection means, said contact array pin contacts extending outboard of said at least one recess; and
 (i) further including a cover sealingly extending over said at least one chip-holding recess.

11. A semiconductor chip carrier and contact array package comprising
 (a) a first dielectric layer;
 (b) at least one aperture in said layer;
 (c) chip connection means, having one or more discrete wire bond layers, for connecting chip contacts thereto, said chip connection means being bonded to a surface of said dielectric layer, said chip connection means including multiple discrete metallization patterns;
 (d) at least one chip-holding recess in said chip connection means;

(e) a base of heat-conductive material extending across said at least one aperture and below said chip connection means;
(f) said base lying at least in part across said at least one recess;
(g) an integrated circuit chip mounted in said at least one recess in heat-conductive contact with said base;
(h) a contact array of pin contacts extending to and in electrical contact with particular ones of said multiple discrete metallization patterns and extending from said chip connection means, said contact array pin contacts extending outboard of said at least one recess; and
(i) further including an insulative layer extending over said chip connection means and having a recess of greater area than and aligned with said chip-holding recess and in which said chip-holding recess is bound by a ledge for mounting additional electronic components.

* * * * *